United States Patent
Inagawa et al.

[11] Patent Number: 5,912,597
[45] Date of Patent: Jun. 15, 1999

[54] PRINTED CIRCUIT BOARD

[75] Inventors: Hideho Inagawa; Tomoyasu Arakawa, both of Yokohama; Toru Otaki; Yasushi Takeuchi, both of Tokyo; Yoshimi Terayama, Odawara; Toru Osaka, Yokohama, all of Japan

[73] Assignee: Canon Kabushiki Kaisha, Tokyo, Japan

[21] Appl. No.: 08/413,908

[22] Filed: Mar. 30, 1995

[30]  Foreign Application Priority Data

Mar. 31, 1994 [JP] Japan .................................. 6-063930

[51] Int. Cl.⁶ ...................................................... H03H 1/00
[52] U.S. Cl. ............................ 333/1; 174/35 R; 174/265; 333/12
[58] Field of Search .......................... 333/1, 12; 361/778, 361/780, 794, 795; 174/35 R, 265

[56]  References Cited

U.S. PATENT DOCUMENTS

| | | | |
|---|---|---|---|
| 4,353,040 | 10/1982 | Krumm et al. .............................. | 333/1 |
| 4,926,549 | 5/1990 | Yoshizawa et al. ....................... | 29/876 |
| 5,197,892 | 3/1993 | Yoshizawa et al. ....................... | 439/91 |
| 5,285,018 | 2/1994 | Pence, IV ............................ | 361/794 X |
| 5,288,949 | 2/1994 | Crafts .................................. | 361/778 X |

FOREIGN PATENT DOCUMENTS 147032  10/1989  Japan .

*Primary Examiner*—Paul Gensler
*Attorney, Agent, or Firm*—Fitzpatrick, Cella, Harper & Scinto

[57]  ABSTRACT

A printed circuit board capable of suppressing radiation noise efficiently includes a first conductive layer where a plurality of power lines are provided at predetermined spacing along one direction, a second conductive layer where a plurality of power lines are provided at predetermined spacing along a direction orthogonal to the one direction, and a plurality of plated through holes for connecting the power lines on the first conductive layer and the power lines on the second conductive layer at the overlapping points of those lines. The power lines contain thin lines and thick lines spaced between a plurality of the thin lines. The predetermined spacing is determined based on a rising time or falling time of the output signal of the IC to be mounted on the circuit board.

21 Claims, 15 Drawing Sheets

PRINTED CIRCUIT BOARD

BACKGROUND OF THE INVENTION

The present invention relates to a printed circuit board designing method to efficiently suppress radiation which may occur on printed circuit boards and, more particularly, to a printed circuit board where such radiation is suppressed.

Generally, a printed circuit board on which power line patterns and ground line patterns are formed often has a multi-layer structure. Such multi-layer structured printed circuit board has power line patterns and ground line patterns in an inner layer, and has signal line patterns on a surface layer on which circuit parts are placed. On the other hand, a double-sided printed circuit board and a single-sided printed circuit board have power line patterns and ground line patterns in a space where signal line patterns are not formed.

Conventionally, as to power line patterns and ground line patterns formed on a printed circuit board, no special attention has been paid to the relation between the line patterns and signal frequencies which may become radiation noise sources. For this reason, the inductance of a layer where power line patterns are formed and that of a layer where ground line patterns are formed vary extremely, especially, the inductance of some portions is much higher than that of other portions. When direct current is passed through this high inductance portion, potential change occurs, resulting in high-level radiation. More specifically, when signals are transferred among active devices such as IC's and oscillators on the printed circuit board, current through the line patterns cause a magnetic field. Further, if conductors have impedance, potential difference due to the positional difference among the conductors cause an electric field. This magnetic field and electric field become plane waves and they are radiated to diffuse at remote points. The radiation noise affects the other signals, and causes problems such as reflection noise, crosstalk or delay in transfer of the other signals.

To prevent the ill effects caused by the radiation noise, resistors have been inserted in the patterns, or inductors and capacitors having frequency characteristics to cut off high frequency components have been inserted in the patterns. However, this addition of parts changes the design and increases costs.

For example, as shown in FIG. 1, Japanese Patent No. 1-47032 introduces a printed circuit board having a plurality of parallel ground lines 121 and a plurality of parallel power (e.g., Vcc) lines 122 on the rear surface, and having a plurality of parallel ground lines 131, orthogonal to the ground lines 121 and a plurality of parallel power lines 132, also orthogonal to the power lines 122, on the front surface. As shown in FIG. 2, the ground lines 121 on the rear surface are connected with the ground lines 131 on the front surface at the overlapping points via through holes 134. Also, the power lines 122 on the rear surface are connected with the power lines 132 on the front surface at the overlapping points via through holes 136. The power lines and the ground lines are connected with each other at a plurality of predetermined positions via capacitors for preventing noise. As it is apparent from FIG. 1, this printed circuit board has a plurality of through holes 150 in which lead pins of IC's are inserted to attach the IC devices on the circuit board. As shown in FIG. 2, upon attaching IC's, if an IC is a DIP (dual in-line package) type IC that has fourteen pins, the power pin (pin #14) is inserted into a through hole 110, and the ground pin (pin #7) of the adjacent IC is inserted into a through hole 111.

However, the inventors of the present application have tested this printed circuit board of the prior art and found that the circuit board cannot reduce the radiation noise level although the circuit board has a capacitor for noise prevention. They found that this is because the capacitor is connected to the power pin of an IC package and the ground pin of a diffecent IC package. It should be connected to the power and ground pins of an IC package.

The inventors have studied the phenomena and concluded that in this prior art, the grid arrangement of the ground lines and the power lines as shown in FIG. 1 is made corresponding to the lengths of the IC packages, i.e., the ground lines and the power lines are arranged in a grid so that the power pin and the ground pin of the DIP type IC (in a DIP type IC, these pins are at the both ends in the longitudinal direction) can be respectively inserted into the through holes 110 and 111. However, recent IC's have a high operation frequency, and when the power lines and the ground lines are arranged at spacings corresponding to the longitudinal lengths of the IC's, electromagnetic waves radiated from the signal lines or power lines have considerably high noise levels. The present inventors have found that the high-level electromagnetic waves cause erroneous operation of the circuit, or in other circuits on the board or other board.

SUMMARY OF THE INVENTION

The present invention has been made in consideration of the above situation, and has as its object to provide a printed circuit board designing method which can efficiently suppress a radiation noise.

The object above described is attained by providing a method for designing a printed circuit board having a plurality of substantially parallel power lines thereon and a signal line thereon provided between two of the power lines, comprising:

(a) determining a target frequency which may cause a noise; and (b) determining a spacing between the power lines based on the frequency determined in said step (a).

The above object is further attained by providing a designing method for designing a printed circuit board having a plurality of parallel power lines and a signal line provided between two of the power lines, comprising:

(a) determining a target frequency which may cause a noise;

(b) determining a cross-sectional area formed with two of the power lines adjacent to each other, based on the frequency determined in said step (a); and (c) determining a spacing between two of the power lines based on the cross-sectional area determined in said step (b).

According to the present invention as constructed above, since a spacing between the power lines is determined on the basis of a frequency which may cause a noise radiation, noise will be suppressed.

Another object of the present invention is to provide a designing method for determining a spacing between power supply lines and power return lines that can efficiently reduce a radiation noise.

The object above is attained by providing a method in which the spacing is determined as a spacing between one of the power-supply lines and one of the power-return lines adjacent to each other.

A further object of the present invention is to provide a printed circuit board which does not radiate a noise.

The above object is attained by providing a printed circuit board having a plurality of power-supply lines and a plurality of power-return lines on a first layer, wherein the plurality of power-supply lines and the plurality of power-return lines are provided on said first layer so that one of the power-supply lines and one of the power-return lines alternate in parallel, and wherein a spacing between one of the power-supply lines and one of the power-return lines adjacent to each other is determined based on a target frequency which may cause a noise on said circuit board.

Yet another object is to provide a designing method that can suppress a radiation noise by through holes provided between power lines and between ground lines.

The above object is attained by providing a designing method for designing a printed circuit board having: a first conductive layer where a plurality of first power lines are provided in substantially parallel; a second conductive layer, where a plurality of second power lines are provided in substantially parallel and in a direction different from that of the first power lines, separated from said first conductive layer via an insulation layer by a predetermined distance; and a plurality of through holes respectively for electrically connecting one of the first power lines on said first conductive layer with one of the second power lines on said second conductive layer at an overlapping point where the first power line and the second power line cross, said method comprising:

(a) determining a target frequency which may cause a noise;

(b) determining a spacing between a couple of through holes for connecting one of the first power lines and the second power lines which intersect said one of the first power lines, based on the target frequency determined in said step (a).

Yet a further object of the present invention is to provide a printed circuit board that can provide not only a enough capacity of current but exhibits a proper inductance by combining thick lines and thin lines.

The above object is attained by providing a printed circuit board having a plurality of power-supply lines and a plurality of power-return lines on a first layer, wherein the power-supply lines and the power-return lines are provided on said first layer so that one of the power-supply lines and one of the power-return lines alternate with each other in substantially parallel, wherein the power-supply lines form a pattern where one thick line is provided at every n ($\geq 2$) thin lines, wherein the power-return lines form a pattern where one thick line is provided at every m ($\geq 2$) thin lines, and wherein a spacing between one of the power-supply lines and one of the power-return lines adjacent to each other is determined based on the target frequency on said circuit board.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

Preferred embodiment of a printed circuit board designing method according to the present invention will be described in detail in accordance with the accompanying drawings, and the structure of a printed circuit board designed by the method will be described.

<Designing Principle>

As it will be described later, a printed circuit board designed by a designing method of the embodiment has a plurality of parallel lines in one direction on one surface, and a plurality of parallel lines in one direction on the other surface. The lines on the both surfaces form two-level parallel crossings. In designing this circuit board, the determination of spacings between lines is important. In the following designing method, two designing principles from two different viewpoints to determine the spacing between the lines will be described. One of these designing principles may be selected depending upon "circuit characteristics" to be realized on the circuit board as the designing object:

(1) IC output characteristic ($t_r$ and/or $t_f$)

(2) The maximum frequency of the signal used on the circuit board

Accordingly, the designing principles will be described in accordance with these two "circuit characteristics".

Designing Based On $t_r$ and/or $t_f$

In a digital circuit, a system operating frequency and allowable rising time/falling time characteristics (abbreviated to "tr and/or tf") of signals in the system have influence upon the performance of the digital circuit.

Figure 1:
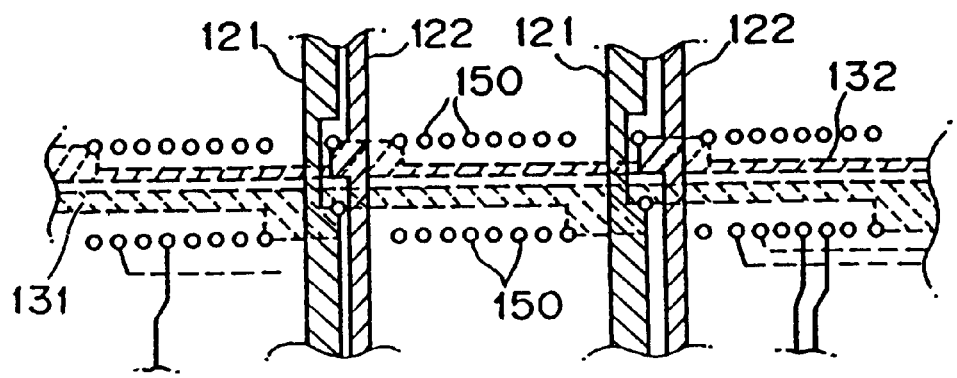
FIGS. 1 and 2 illustrates the structure of a printed circuit board according to a conventional state of the art.
Figure 2:
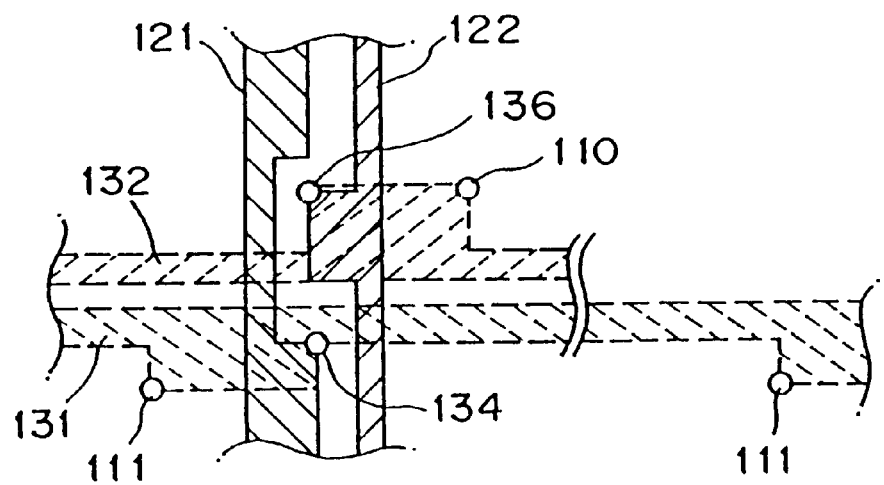
Figure 3:
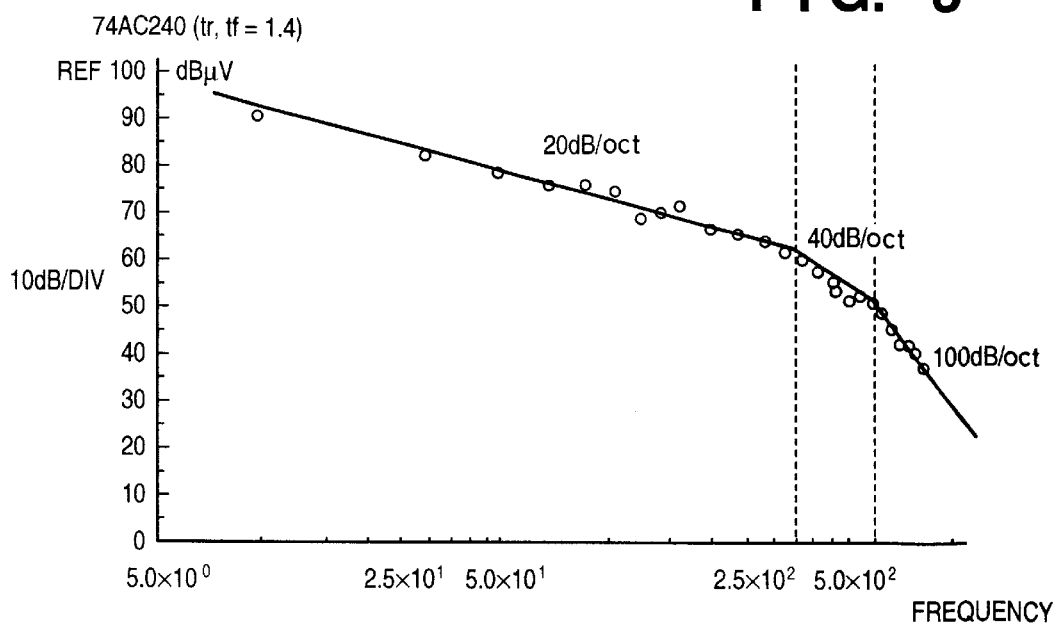
FIGS. 3 and 4 are graphs for explaining how rising/falling time cause problems in a printed circuit board designing method according to an embodiment of the present invention.
Figure 4:
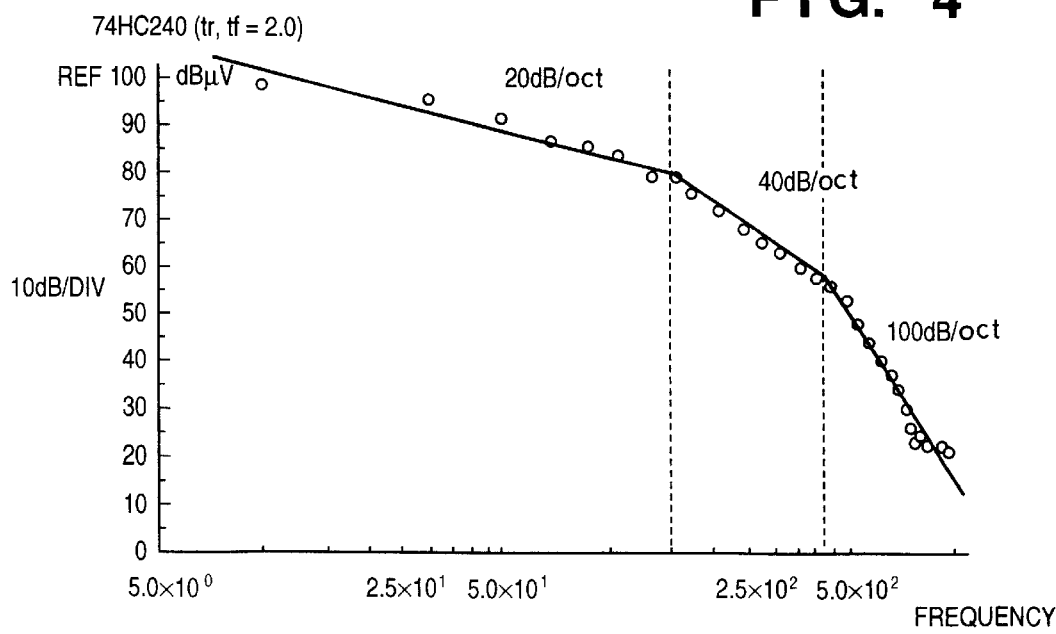

FIGS. 3 and 4 show the intensity levels of radiation noise when IC devices 74AC240 and 74HC240, manufactured by Toshiba and Motorola, operate. The tr and/or tf of the IC 74AC240 is 1.4 ns, and that of the IC 74HC240 is 2.0 ns. As it is apparent from these figures, as the characteristic tr and/or tf is lower, the intensity level of the radiated electromagnetic wave is maintained high to a higher-frequency band. That is, as the characteristic tr and/or tf is lower (the high-frequency component within a signal is at a higher level), high-level electromagnetic wave is radiated over a wide frequency bands.

The electromagnetic wave includes a progressive wave and a standing wave. The present inventors picked up the latter wave as a wave that has the greatest influence upon digital circuits as radiation noise. In a standing wave, the relation between the frequency (f) and the wavelength ($\lambda$) is expressed as follows:

f=C/$\lambda$ (C: speed of light)

The standing wave often occurs on a line of a circuit pattern having a length corresponding to the wavelength ($\lambda$) or ($\frac{1}{2}$)$\lambda$. That is, a circuit pattern having such length functions as an antenna radiating the standing wave having the wavelength $\lambda$. On the contrary, if the pattern length is ($\frac{1}{20}$)$\lambda$ or shorter, the potential difference on the pattern is $\frac{1}{2}$ of the amplitude of the signal or less.

Figure 5:
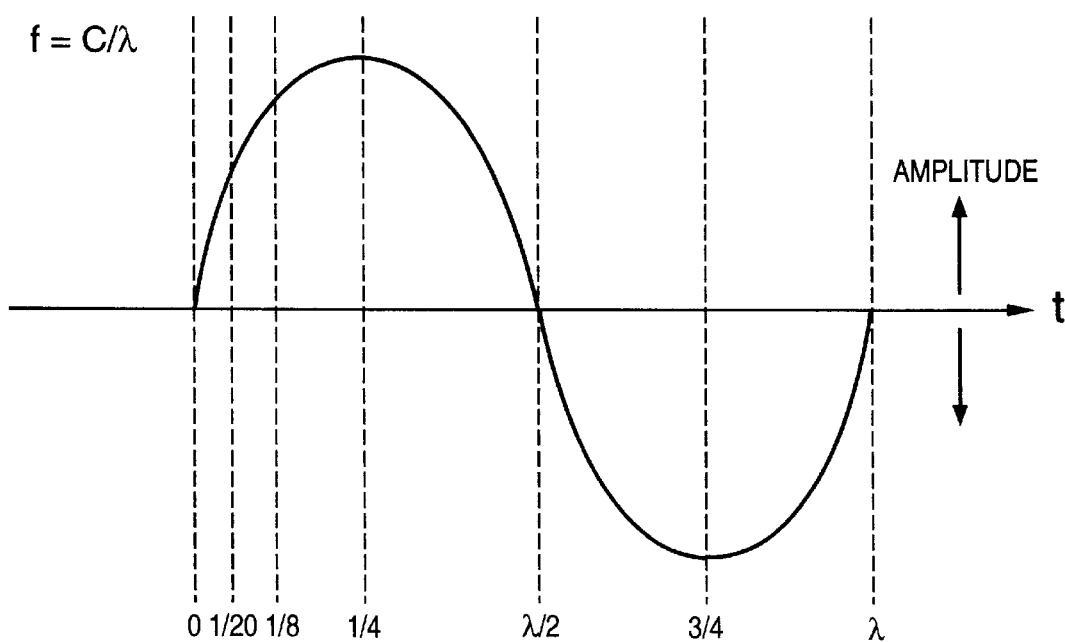
FIG. 5 is a graph showing the principle of the designing method of the embodiment.

Accordingly, the inventors concluded that in a circuit system where erroneous operation can be prevented if the potential difference due to the influence by a radiated electromagnetic wave is $\frac{1}{2}$ of the wavelength amplitude or less, the length of the circuit line should be ($\frac{1}{20}$)$\lambda$ or shorter. FIG. 5 shows the relation between a standing wave length $\lambda$ of a frequency f and the length of a pattern. What frequency actually causes problems in a circuit system depends on the character tr and/or tf of a device used in the circuit system. The tr and/or tf of recent IC's is 1 ns or lower. As shown in FIGS. 3 and 4, the frequency at a transitional point where the noise level changes from 20 dB/oct to 40 dB/oct should be the frequency $f_T$ that causes noise. This frequency $f_T$ is obtained from:

$$f_T = \frac{1}{\pi \cdot t_r} \quad (1)$$

$$f_T = \frac{3}{\pi \cdot t_r}$$

$$f_T = \frac{3 \times 10^{-9}}{\pi} = (GHz)$$

$$l = \alpha \cdot \frac{1}{f_T} \cdot \frac{1}{20}$$

$$l = \alpha \cdot \frac{\pi \cdot C \cdot t_{r(f)}}{3 \cdot 20}$$

$$Z_0 = \sqrt{\frac{R + j\omega L}{G + j\omega C}}$$

$$V = L \cdot \frac{di}{dt}$$

On the other hand, a signal from an IC includes a high-frequency component twice or thrice higher than the frequency $f_T$. Accordingly, in this embodiment, on the assumption that the signal includes a high-frequency component thrice higher than the frequency $f_T$, the frequency $f_T$ that causes noise is defined by:

$$f_T = \frac{3}{\pi \cdot t_r} \quad (2)$$

As to recent IC's having tr and/or tf of about 1 ns or lower, the frequency $f_T$ is defined by:

$$f_T = \frac{3 \times 10^{-9}}{\pi} = 1(GHz) \quad (3)$$

If the circuit board comprises two layers, a dielectric constant $\epsilon_r$ of the printed circuit board is 3.0, and if the circuit board comprises more than two layers, the dielectric constant $\epsilon_r$ is 4.8. In consideration of wavelength reduction effect by this dielectric circuit board, the wavelength $\lambda$ of the 1 GHz signal obtained from the equation (3) is about 150 mm. As described above, if the line length of a pattern is set to ($\frac{1}{20}$)$\lambda$ or shorter, the intensity level of the electromagnetic wave is substantially lowered. Accordingly, in a circuit system using an IC having a tr and/or tf of 1 ns or less, the line length of the pattern may be set to 7.5 mm (=150 mm/20) or shorter. That is, assuming that the wave length reduction rate of the circuit board is $\alpha$, the length l of the signal lines on the circuit board may be set to:

$$l = \alpha \cdot \frac{1}{f_T} \cdot \frac{1}{20} \quad (4)$$

or shorter.

Inserting the equation (2) into the inequality (4) gives:

$$l = \alpha \cdot \frac{\pi \cdot C \cdot t_{r(f)}}{3 \cdot 20}$$

Note that it is desirable to set the line length of the circuit pattern about the length obtained by the inequality (4), since too short signal lines might increase costs.

Figure 9:
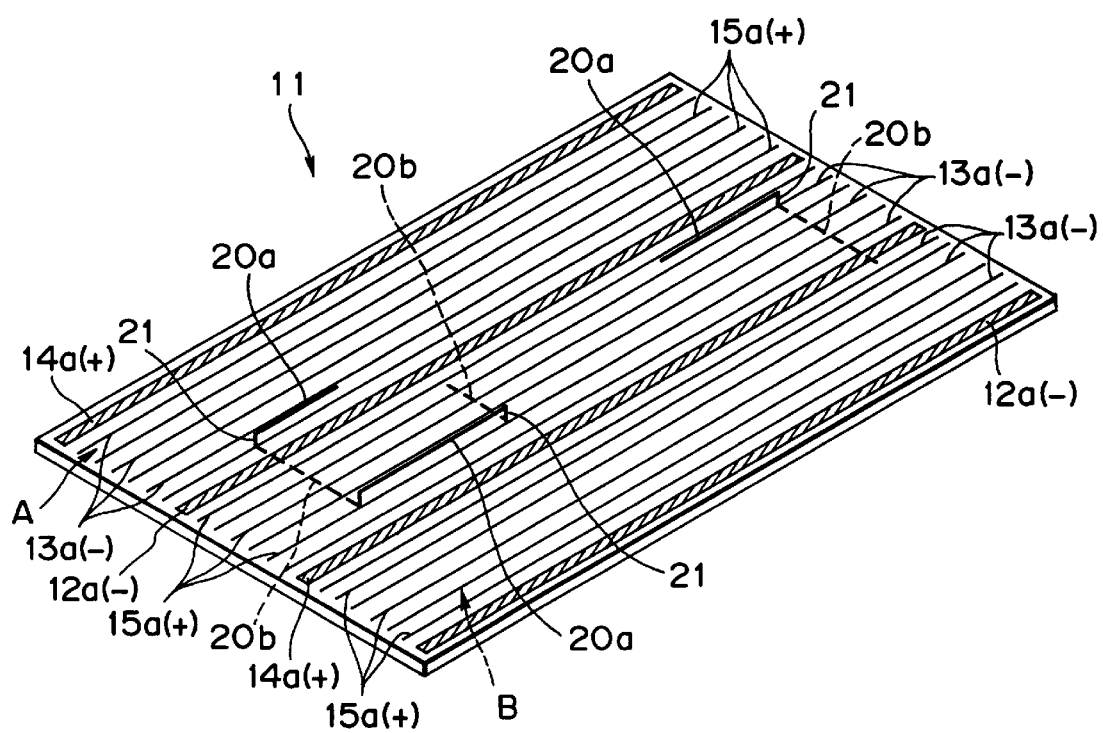
FIG. 9 is a perspective view showing a double-sided printed circuit board, where the designing method of the embodiment is applied.
Figure 10:
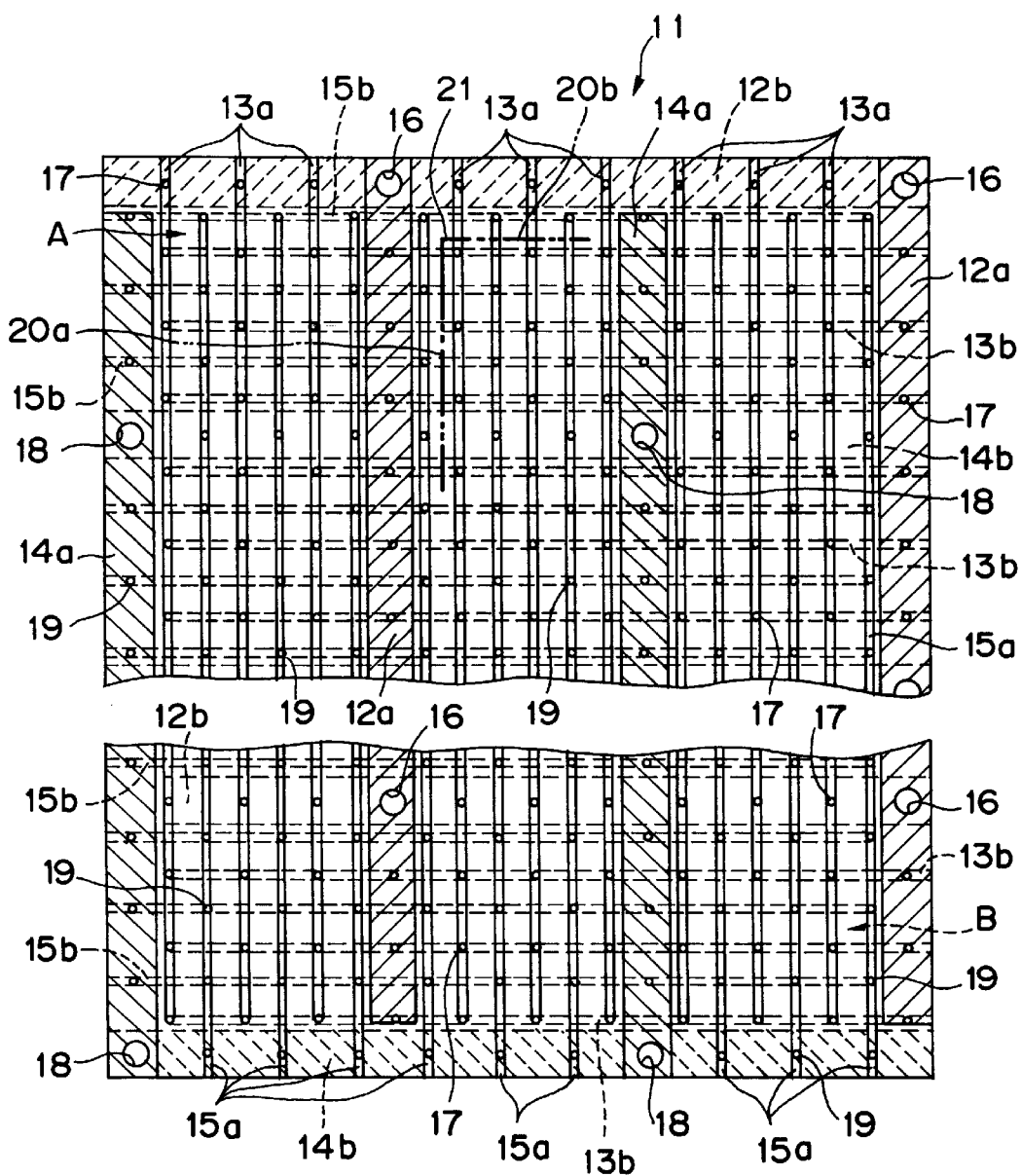
FIG. 10 is an enlarged plan view of the double-sided printed circuit board in FIG. 9.

In designing the circuit board, the arrangement of IC device packages is made prior to all others, for this reason, setting of the signal line length is often difficult. Accordingly, in this embodiment, the spacing between power lines or ground lines is set to a value within a predetermined range, and signal lines are inserted between the power lines or the ground lines, otherwise between the power lines and the ground lines so as to adjust the lengths of the signal lines. Further, power line patterns and the ground line patterns are formed on the front and rear surfaces of the circuit board in such manner that the power line patterns and the ground line patterns on the front surface are orthogonal to the power line patterns and the ground line patterns on the rear surface. The power lines on the front surface and the power lines on the rear surface are connected at the overlapping points via through holes, and the ground lines on the front surface and the ground lines on the rear surface are connected at the overlapping points via through holes, thus practically controlling the distances between a signal line and power/ground pattern line. FIGS. 9 and 10 show this arrangement of the power lines and the ground lines.

Figure 6:
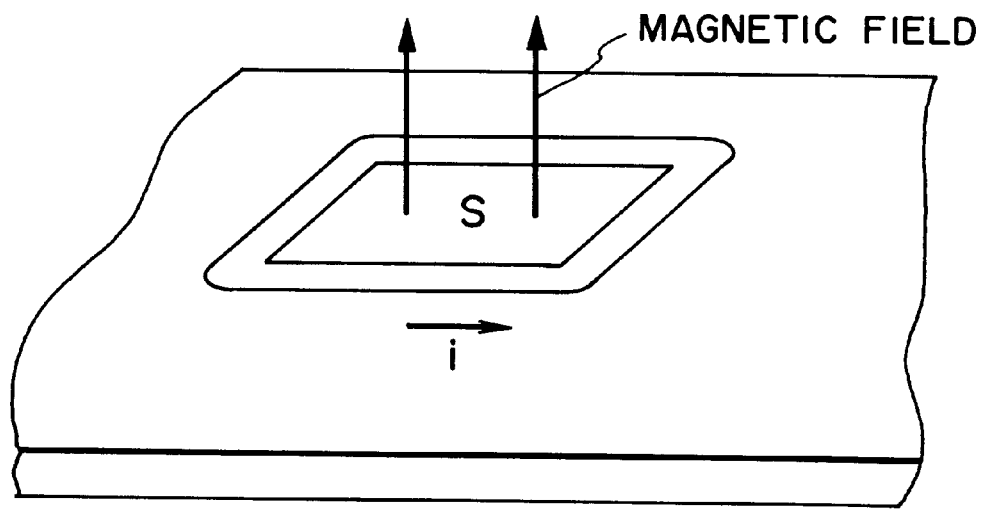
FIGS. 6 to 8 are explanatory views showing the principle of the designing method of the embodiment.
Figure 7:
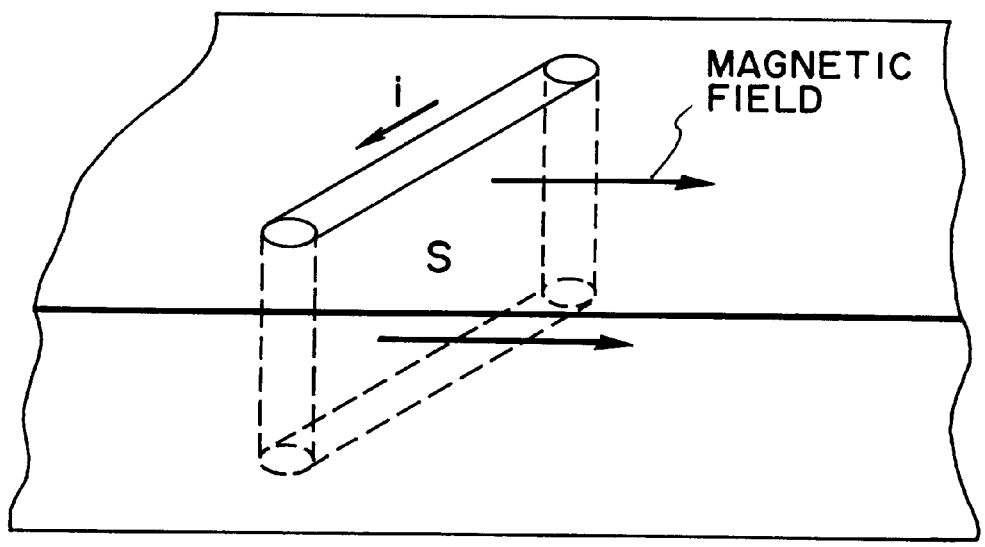

FIGS. 6 and 7 show the adjustment of signal line length in the present designing method. FIG. 6 shows a current i that flows through a loop signal line on the front (rear) surface of a circuit board. Similarly, FIG. 7 shows the current i that flows through two signal lines, on the front and rear surfaces of the circuit board, connected via through holes to be a loop. In FIGS. 6 and 7, assuming that the cross-sectional area of the loop is S, a magnetic flux $\Phi$ generated by the current i is defined as follows:

$\Phi = k \cdot i \cdot S$ (k=constant)

The intensity of a radiated electromagnetic wave generated by the loop is dependent on the size of the magnetic flux Φ. Then, reducing the magnetic flux Φ lowers the intensity of the electromagnetic wave. In conventional circuit board designing, the current value i is lowered so as to reduce the magnetic flux Φ, while the present designing method reduces the area S to reduce the magnetic flux Φ. That is, in this method, the spacing between the power lines on the front/rear surface and the ground lines on the front/rear surface, the spacing between the power lines, and the spacing between the ground lines are defined in accordance with the above four expressions (1) to (4).

Figure 8:
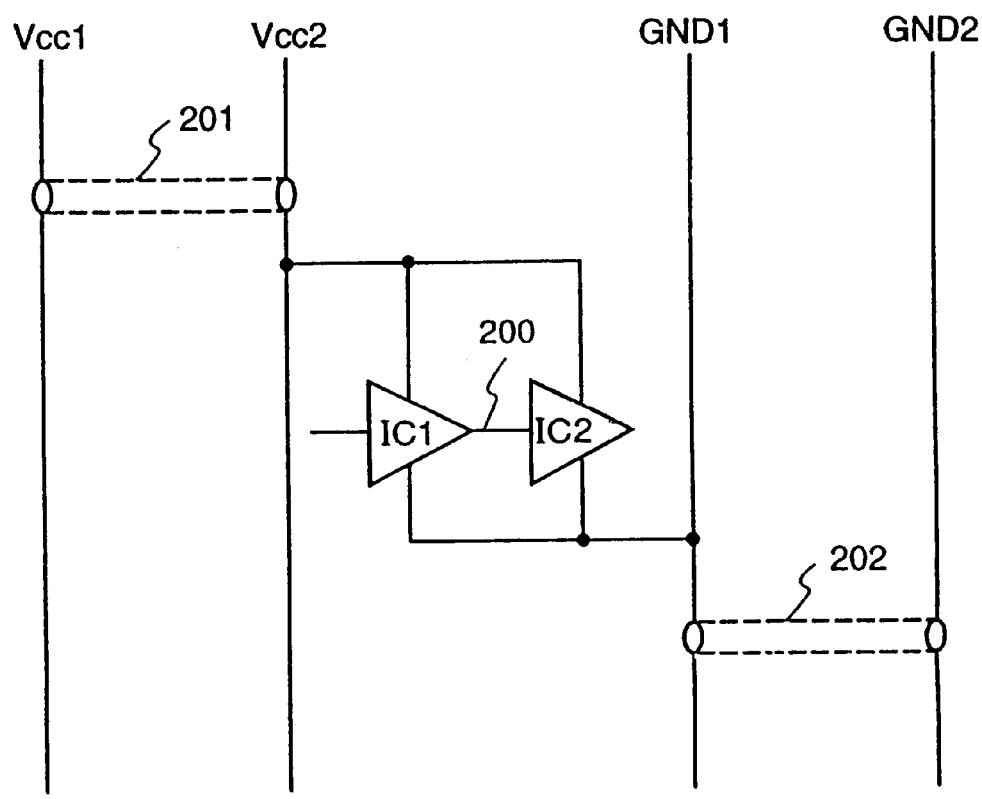

FIG. 8 shows a signal line 200 connecting an IC 1 and an IC 2 provided between a power line $V_{CC}2$ and a ground line $G_{ND}1$ on a circuit board. The current flows from the power line $V_{CC}2$ to the both IC's 1 and 2, and then to the ground line $G_{ND}1$. A part of the current flows through the signal line 200. Assuming that a power line $V_{CC}1$ is provided near the power line $V_{CC}2$, a part of the current flows from the power line $V_{CC}1$ to the ground line $G_{ND}2$. Generally, power lines have low impedance and there is no potential difference between the power lines. However, on a high-density circuit board, the power lines have impedance of a certain level. In this case, there is a potential difference between the ground lines $G_{ND}1$ and $G_{ND}2$. As the power line $V_{CC}1$ and the ground line $G_{ND}2$ are located further away than the power line $V_{CC}2$ and the ground line $G_{ND}1$ with respect to the IC's as the center, if the amount of the current from the power line $V_{CC}1$ to the ground line $G_{ND}2$ is large, the cross-sectional area of the current loop as described in connection with FIGS. 6 and 7 becomes large.

Then, a through hole 201 is provided to connect the power lines $V_{CC}1$ and $V_{CC}2$ so as to adjust the potentials of the power lines $V_{CC}1$ and $V_{CC}2$ around the IC 1 to nearly equal levels. Similarly, a through hole 202 is provided to connect the ground lines $G_{ND}1$ and $G_{ND}2$ so as to adjust the potentials of the ground lines $G_{ND}1$ and $G_{ND}2$ around the IC 2 to nearly equal levels. Thus, most of the current flowing through the signal line 200 is supplied from the power line $V_{CC}2$ into the ground line $G_{ND}1$. That is, current flows through the power line $V_{CC}2$ and the ground line $G_{ND}1$ closer to the signal line 200 than the power line $V_{CC}1$ and the ground line $G_{ND}2$. Further, providing wirings on the surfaces of the substrate in parallel crossing manner in addition to providing the adjacent through holes enforces connections or coupling, and provides concentrated high frequency current on the IC's and the signal lines. In this manner, the cross-sectional area of the signal current loop can be reduced, and the intensity of the radiated electromagnetic wave can be lowered.

Thus, if a power line or ground line is provided around a signal line, the mutual inductance between the signal line and the power line or ground line increases, which lowers the impedance. This is because the direction of the current flowing through a signal line and that through a ground line are opposite to each other, and this lowers the effective inductance of the entire system. At this time, the relation among inductance L, capacitance C and impedance $Z_0$ is expressed as follows:

$$Z_0 = \sqrt{\frac{R + j\omega L}{G + j\omega C}}$$

R: resistance
G: conductance

In a case where the circuit board has a multi-layer structure, if a solid ground pattern is formed within an inner layer, the ideal loop area is:

pattern length x layer thickness

However, in a case where the pattern is a solid pattern, return current inconveniently flows through an arbitrary route within the pattern. Accordingly, as described above, the embodiment employs a method constructing a parallel crossing structure by forming a parallel line pattern on the front surface of a circuit board and a parallel line pattern on the rear surface of the circuit board orthogonally to the line pattern on the front surface.

In this manner, the spacing between power lines (or ground lines) is shortened so as to reduce the cross-sectional area S. Next, suppression of an electric field caused by the potential difference due to the positional difference between signal lines will be described below.

A difference of electric potential (voltage) is determined based on the amount of change in current and the inductance within a line through which the current flows. That is, the potential difference V is defined by:

$$V = L \cdot \frac{di}{dt}$$

Reducing the inductance L leads to reduction of potential difference V between signal lines at different positions, resulting in suppression of the electric field that causes noise. As will be described later, as to the circuit board having the parallel crossing structure as shown in FIGS. 9 and 10, the impedance of each of the ground lines and the power lines is lowered, thus the potential difference is small and the electric field is suppressed.

That is, the present designing method suppresses radiation noise with reduction of potential difference by reducing the cross-sectional area of a current loop and inductance.

Designing Based On Maximum Frequency Within Signal

Normally, when a high-speed repeating signal such as a clock signal has a high frequency, the signal requires a small tr and/or tf. To obtain a usable square wave, the signal must include about the second to the fiftieth harmonics of the fundamental frequency. Accordingly, the spacing between the pattern lines of a solid parallel crossing structure must be determined based on a frequency fifty times the frequency of an alternating signal having the maximum frequency within the circuit. More specifically, if the maximum signal frequency is 30 MHz, the fiftieth harmonic of the signal frequency is 1.5 GHz; and the wavelength of the harmonic is, in consideration of reducing the wavelength on the printed circuit board, about 100 mm. Accordingly, similar to the initial designing principle, to prevent occurrence of a radiated electromagnetic wave having a wavelength of about 100 mm, it is necessary to set the spacing between the signal lines to 1/20 of the wavelength or shorter (i.e., 5 mm or shorter).

<Example Of Designed Circuit Board>

The circuit board designing method is as described above in accordance with two designing principles. Next, an example of a printed circuit board designed by the designing method will be described with reference to FIGS. 9 and 10.

FIG. 9 shows the front surface of a circuit board 11 designed by the present designing method. FIG. 10 is an enlarged view showing the front surface of the circuit board in FIG. 9. In these figures, reference numerals having an alphabet "a" represent parts on the front surface side, and numerals having an alphabet "b", parts on the rear surface side.

In FIG. 9, thick lines 12a represent ground lines; thick lines 14a, power lines; thin lines 13a, ground lines; and thin lines 15a, power lines. That is, in FIG. 9, a rectangular shaped double-sided printed circuit board 11 has a plurality of ground lines 13a (marked with "-"), arranged in parallel at spacings of about 3 mm, extend from one shorter end of a rectangular shape along the longitudinal direction, on the front surface A. The ground lines 13a may have a width of about 1 mm or shorter, otherwise about 0.3 mm. On the front surface A, a power line 15a is provided between two thin ground lines 13a in the same direction. That is, the thin ground lines 13a and the thin power line 15a are alternatively arranged on the front surface A of the circuit board 11.

Further, thick ground lines 12a and thick power lines 14a are provided, and between these thick lines, three ground lines 13a and three power lines 15a are provided on the front surface A. Specifically, as shown in FIG. 9, two thick power lines 14a and two thick ground lines 12a are alternatively arranged on the front surface A of the circuit board 11. The thick power lines and the thick ground lines may have a width of 1 mm or longer, preferably, about 2 mm.

Figure 11:
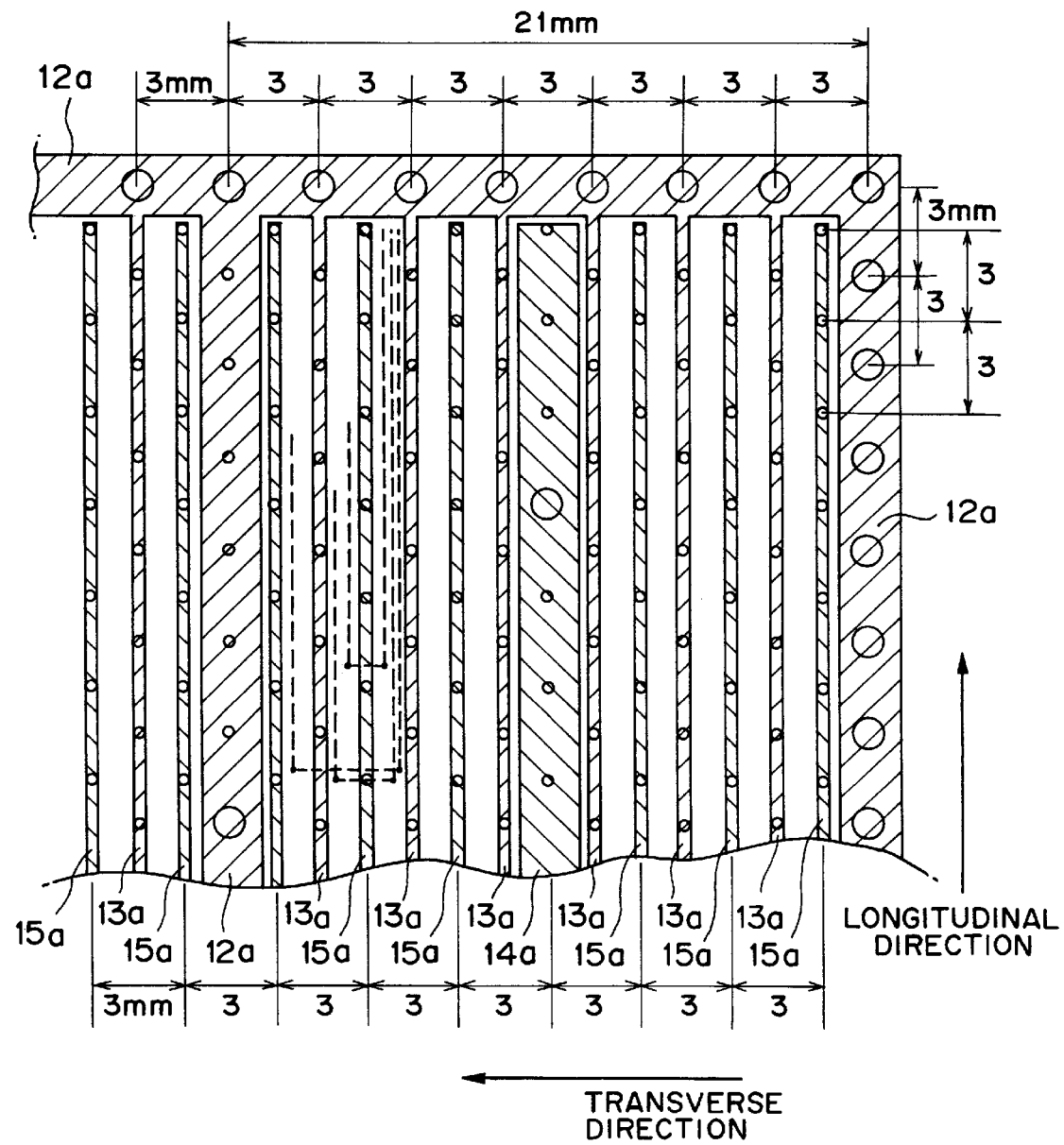
FIG. 11 is an enlarged plan view of the front surface of the printed circuit board in FIG. 9.

Similarly, a plurality of power lines 14a and a plurality of power lines 15a (marked with "+") are provided from the other shorter end of the circuit board 11 in the longitudinal direction at spacings of about 3 mm, in parallel to the ground lines 12a and the ground lines 13a. The power lines 14a have a width of 1 mm or longer (about 2 mm in this embodiment) and the power lines 15a have a width of 1 mm or shorter (about 0.3 mm in this embodiment). Specifically, the thin power lines 15a (six power lines 15a in FIG. 9) are arranged between the adjacent two thick power lines 14a. As a whole, the ground lines 12a, the ground lines 13a, the power lines 14a and the power lines 15a are arranged at spacings of about 1.5 mm. Accordingly, as shown in FIG. 11, the spacing between the axis of adjacent ground line (12a or 13a ) and the power line (14a or 15a ) is about 1.5 mm.

Figure 12:
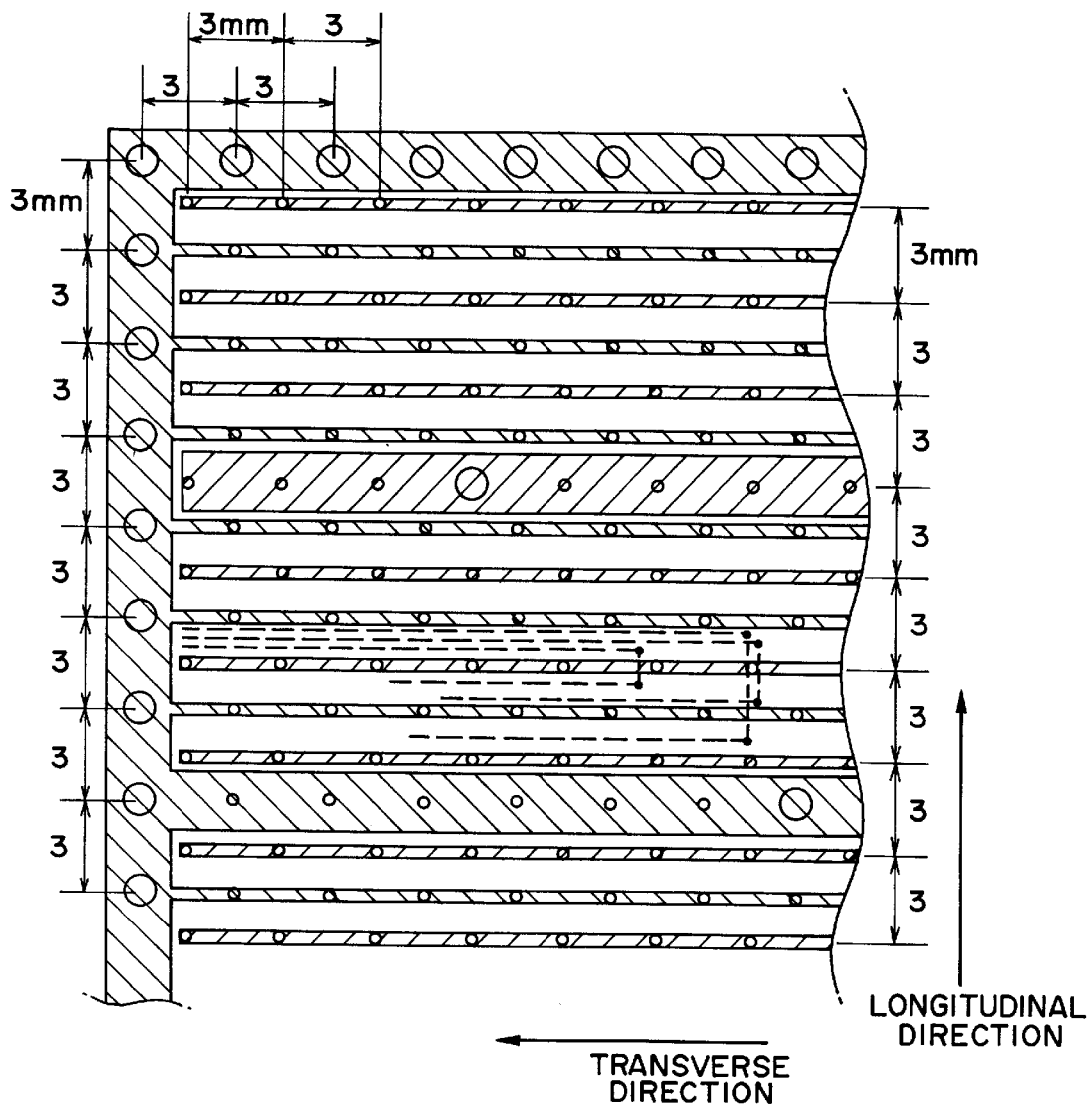
FIG. 12 is an enlarged plan view of the rear surface of the printed circuit board in FIG. 9.

On the rear surface B of the double-sided printed circuit board 11, a plurality of thick ground lines 12b, a plurality of thin ground lines 13b, a plurality of thick power lines 14b and a plurality of thin power lines 15b are provided in parallel. The arrangement of the lines on the rear surface B is similar to that on the front surface A except that the lines on the rear surface B are provided in the transverse direction orthogonal to the lines on the front surface A. FIG. 12 shows the line pattern on the rear surface B.

The power lines (both thick and thin lines) on the front surface A and the power lines (both thick and thin lines) on the rear surface B are connected at the overlapping points via through holes; and the ground lines (both thick and thin lines) on the front surface A and the ground lines (both thick and thin lines) on the rear surface B are connected at the overlapping point via through holes. FIG. 10 shows the connection of the lines by through holes. In FIG. 10, small and large circles 18, 19 represent through holes; specifically, small circles represent through holes respectively for connecting a thin line with a thin line/thick line having the same potential as that of the former thin line, and large circles represent through holes respectively for connecting thick lines having the same potential. In FIG. 10, solid lines represent lines on the front surface side, and broken lines, lines on the rear surface side, for the sake of convenience of illustration. Further, hatched portions with solid lines represent a thick power line or ground line on the front surface side, and hatched portions with broken lines, a thick power line or ground line on the rear surface side.

Figure 13:
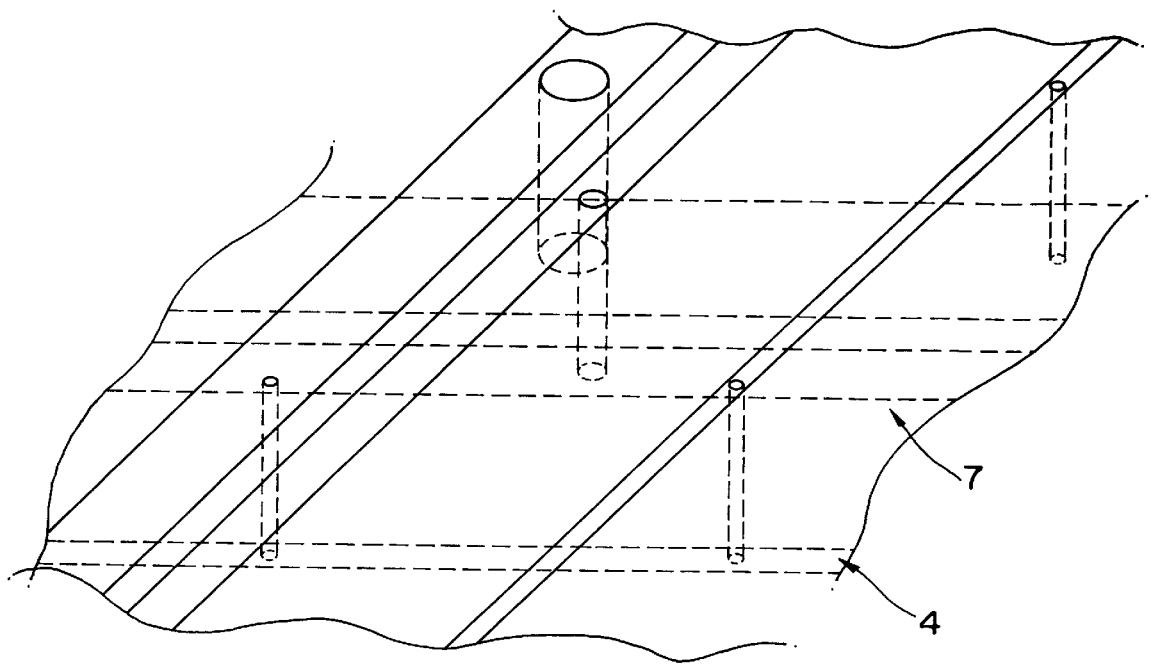
FIG. 13 illustrates the connection of through holes of the printed circuit board in FIG. 9.

FIG. 13 shows the connection of lines with the through holes in a three-dimensional manner.

As it is apparent from FIG. 11, according to the line arrangement of the embodiment, the lengths of the ground/power lines in the longitudinal direction between adjacent two through holes are all 3 mm. Also, as it is apparent from FIG. 12, the lengths of the ground/power lines in the transverse direction between adjacent two through holes are all 3 mm.

Figure 14:
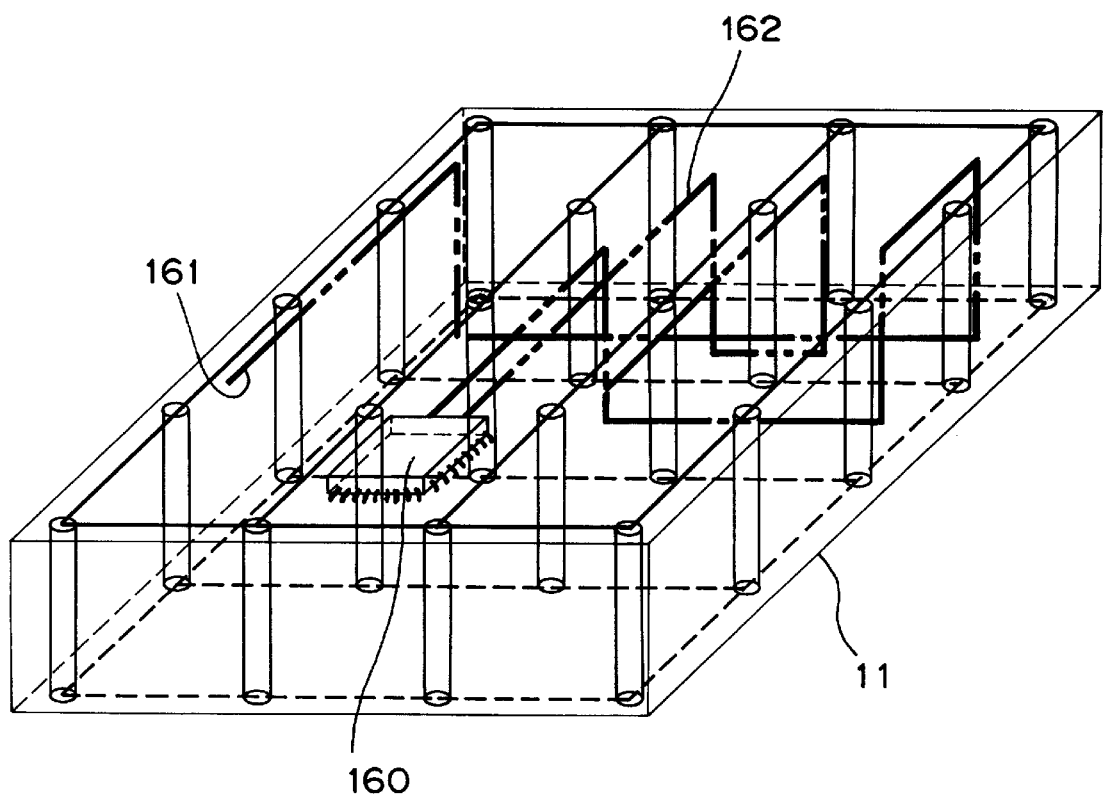
FIG. 14 illustrates the connection between power lines and signals lines at the respective through holes.
Figure 15:
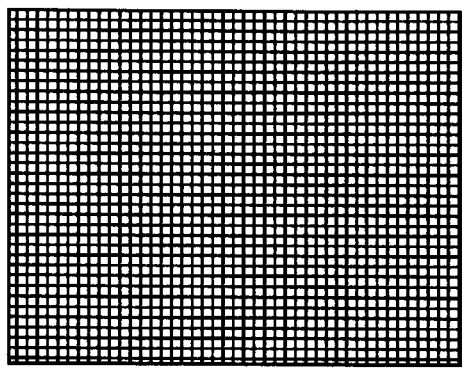
FIGS. 15 to 18 respectively show an example of a power line pattern.
Figure 16:
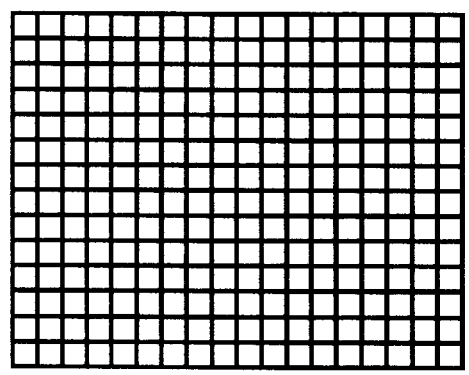
Figure 17:
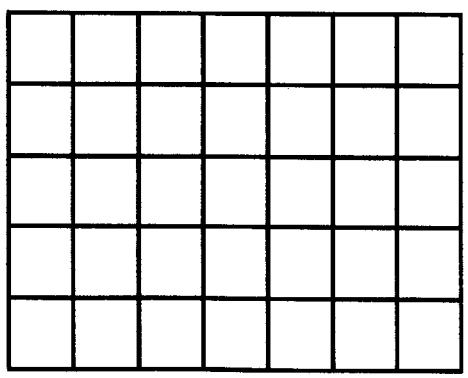
Figure 18:
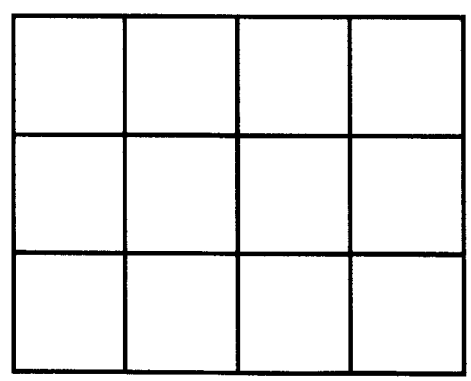

In FIGS. 9 and 10, numeral 20a denotes a signal line provided on the front surface A; and 20b, a signal line provided on the rear surface B. The two signal lines are electrically connected via through holes 21. As described above, on both the front surface A and the rear surface B, the spacing between a power line and an adjacent ground line is 1.5 mm. Assuming that the line width of the signal line is 0.15 mm, up to five signal lines can be provided. In this arrangement, a power line and a ground line are provided with respect to any signal line on both surfaces. As shown in FIG. 14, if an IC 160 is provided on the circuit board 11, two signal lines 161 and 162 from the IC 160 are respectively accompanied with a power line and a ground line within a spacing of 1.5 mm or shorter.

Accordingly, on the circuit board 11 as constructed as in FIGS. 10 to 14, the areas of the loops formed with the signal lines and ground/power lines are small, which reduces magnetic fluxes running through the loops and lowers the intensity of radiated electromagnetic waves. In addition, some lines have a low impedance, which lowers the intensity of electric field that occurs on the circuit board.

FIGS. 15 to 18 graphically show parallel-crossing line patterns in accordance with the spacing between through holes, i.e., about 0 mm, 3 mm, 9 mm and 15 mm.

Test Results

Figure 19:
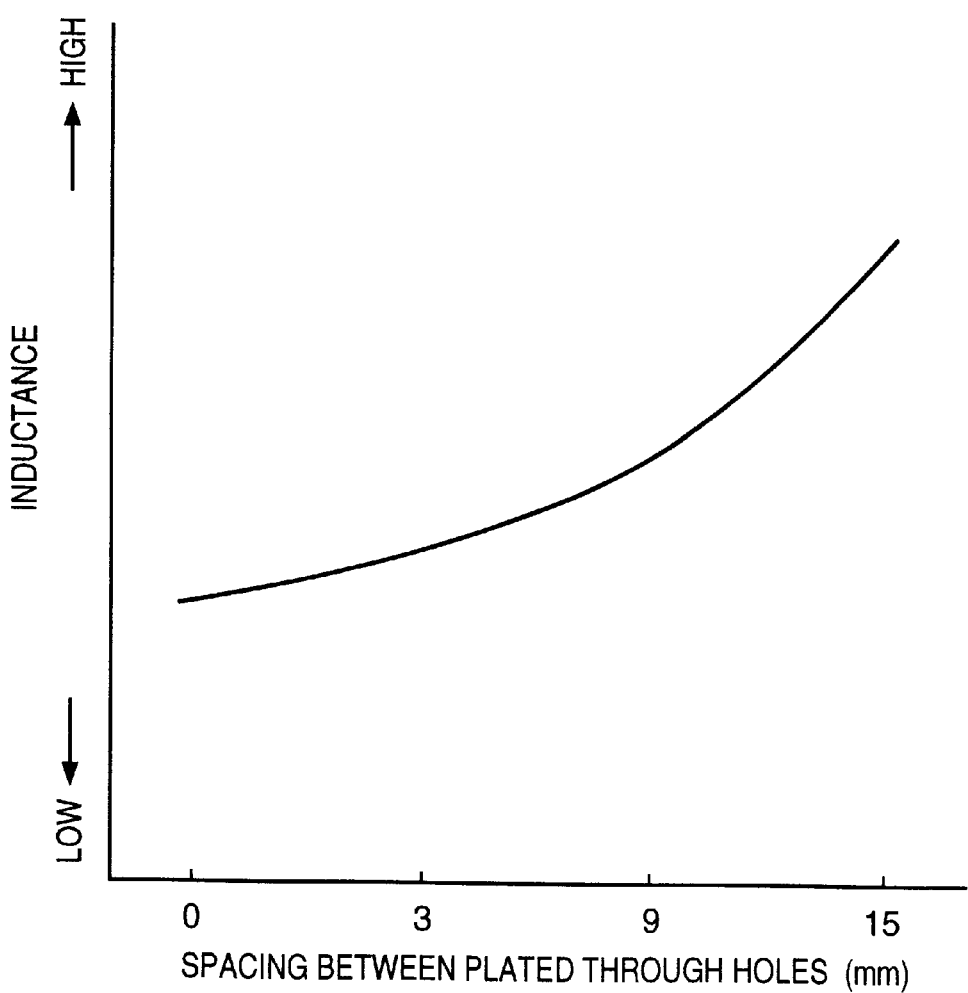
FIG. 19 is a graph showing the relation between the spacing between plated through holes and the inductance of a ground line pattern.
Figure 20:
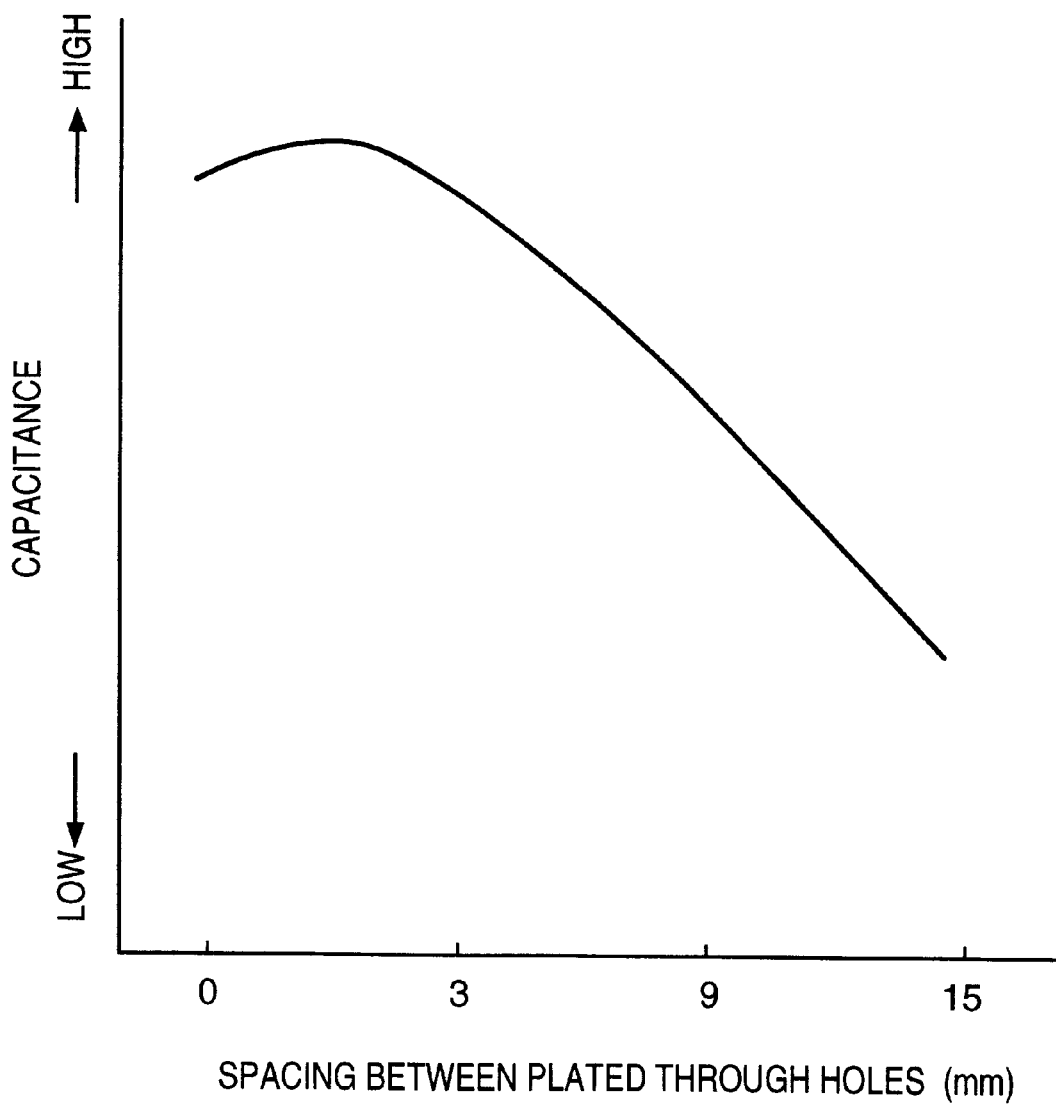
FIG. 20 is a graph showing the relation between the spacing between the plated through holes and the capacitance of the ground line pattern.
Figure 21:
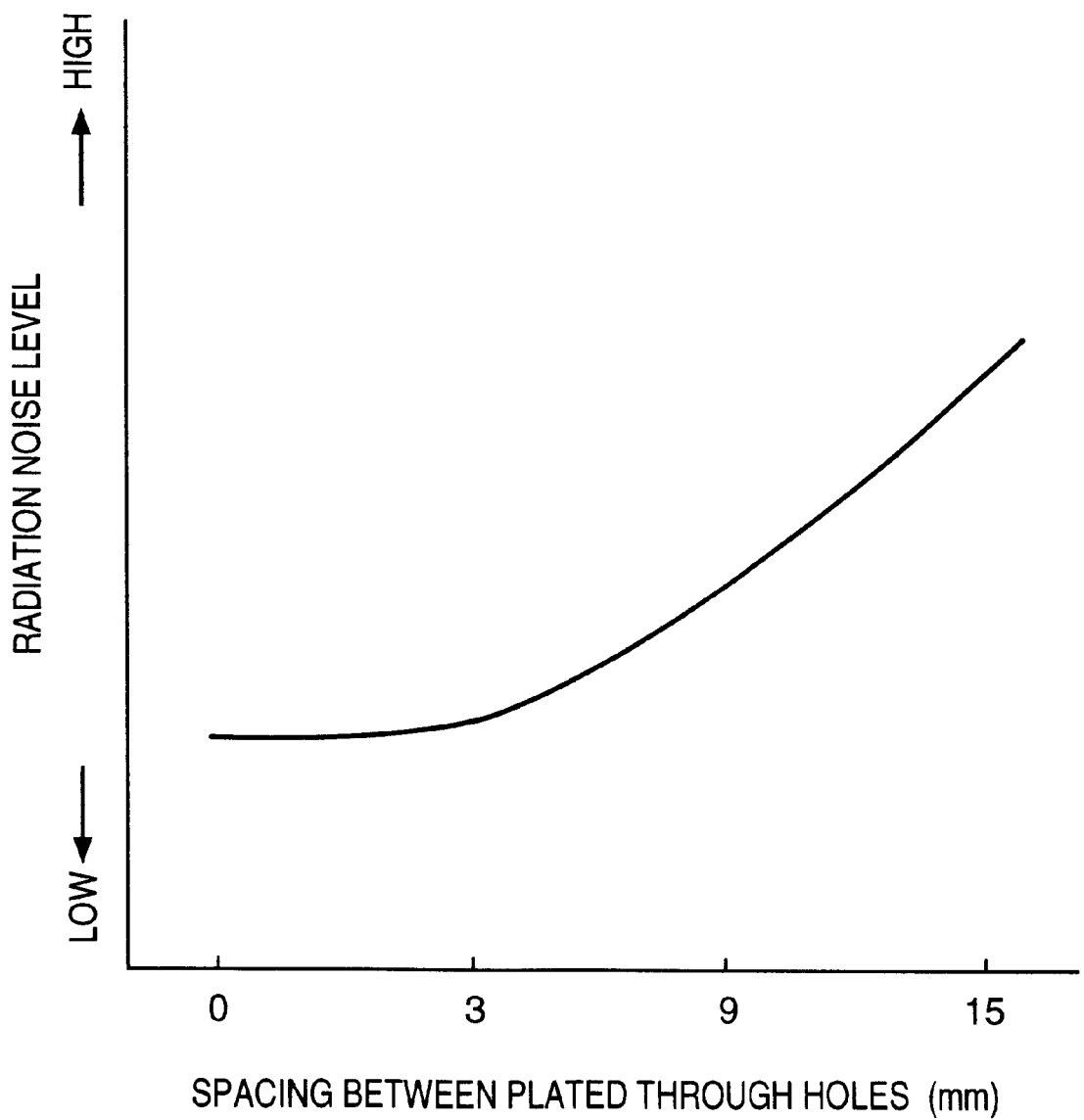
FIG. 21 is a graph showing the relation between the spacing between the plated through holes and radiation noise.

FIG. 19 shows the inductance of a ground line on the circuit board 11 in accordance with the spacing between through holes, i.e., about 0 mm, 3 mm, 9 mm and 15 mm. FIG. 20 shows the relation between the above about 0 mm, 3 mm, 9 mm and 15 mm through hole spacings and the capacitance between the ground line and a power line. FIG. 21 shows the radiation noise when a signal is transferred through the ground line, in accordance with the above about 0 mm, 3 mm, 9 mm and 15 mm through hole spacings.

It is understood from FIGS. 19 to 21 that reducing the spacing between the through holes to a certain length, i.e., about 3 mm, can obtain effects similar to those obtained when the spacing is about 0 mm, i.e., when the ground pattern is a solid pattern.

In the example shown in FIG. 9, the width of the ground lines 12a/12b and the power lines 14a /14b is about 2 mm, because the width may be set to about 1 mm or greater so as to ensure capacity of the lines and to lower the inductance at low frequencies. On the other hand, to lower the inductance at high frequencies, the spacing among the ground lines 13a/13b and the power lines 15a/15b may be set to 5 mm or shorter, especially to about 3 mm. Further, in this example, the width of the ground lines 13a/13b and the power lines 15a /15b is about 0.3 mm to avoid distortion of signal line layout to be described later.

Use Of Thick and Thin Lines

In the designing in FIG. 9, the ground lines include thick lines and thin lines, and the power lines also include thick and thin lines. The thick lines are used to ensure capacity for the line in DC currents and to lower inductance at low frequencies. On the other hand, thin lines are used to lower inductance at high frequencies. The thin lines can be arranged between the signal lines to form fine parallel crossings so as to suppress radiation noise.

In this manner, the designing method of the embodiment employs lines of two thicknesses to obtain advantages complementing to each other.

<Other Advantages Of Embodiment>

① Conventional multi-layer circuit boards have one ground layer. As the frequency becomes higher, current flows merely on the surface of the ground layer due to skin effect. The high-frequency impedance cannot be lowered by increasing the copper foil of the single ground layer. On the other hand, the circuit board of the embodiment is a multi-layer circuit board having a plurality of layers each having solid or parallel-crossing ground patterns. Since the layers have many parallel paths for ground return current with respect to signal current, the high-frequency impedance of the ground of the overall circuit board is lowered.

② Normally, the ground on a circuit board is not an ideal ground, and the ground has inductance. Accordingly, on an actual circuit board, a return current, that flows through the ground while a signal current flows among IC's, leads to voltage spikes due to the inductance, thus causing ground bounce. However, on the circuit board of the embodiment, the solid or parallel-crossing ground patterns formed on other than the ground layer can lower the ground inductance, and as a matter of course lower the voltage spikes. As a result, the ground bounce is reduced.

③ The voltage waveform of a digital signal is normally a trapezoidal pulse waveform. In a case where the output impedance of an output IC is lower than the characteristic impedance of a signal line, the flat part of the trapezoidal waveform has uneven amplitutdes called ringing. The ringing can be reduced by reducing the characteristic impedance of the signal line. However, in the circuit board of the embodiment having solid or parallel-crossing ground patterns on the other layers besides the ground layer, the capacitive coupling between the signal line and the ground is large, which lowers the characteristic impedance of the signal line. As a result, ringing that occurs in a transmission wave can be reduced.

④ In a case where some signal lines are close to each other on a circuit board, the capacitive coupling and the inductive coupling among the signal lines may cause crosstalk. To weaken the capacitive coupling among the signal lines, it is necessary to reduce the distances between the signals and the ground to a possible shortest distance. In the circuit board of the embodiment, the distances between the grounds and the signal lines, arranged on the surface layer and inner layers, are shorter than those of the conventional multi-layer circuit board. In this circuit board, the capacitive coupling among the signal lines is weaken and crosstalk is reduced.

Inductive coupling is in proportion to a current loop formed with signal lines and the return ground. That is, as the current loop becomes larger, the inductive coupling increases. To reduce the current loop, it is necessary to shorten the distances between the signal lines and the ground. Similar to the case of the capacitive coupling, in the circuit board of the embodiment, the distances between the signal lines and the grounds are shorter than those of the conventional multi-layer circuit boards, which reduces the inductive coupling and reduces the crosstalk.

⑤ The intensity of the electromagnetic radiation noise generated by a circuit board is in proportion to the size of the area of a current loop formed with signal lines and the return current of the ground. In a circuit board including a ground layer, such as a multi-layer circuit board, the ground layer exists directly beneath the signal lines, which reduces the current loop. However, the ground layer of the conventional multi-layer circuit board is not an ideal ground layer, for this reason, the ground usually has inductance. The inductance causes the return current to extend over the entire circuit board as well as the ground directly beneath the signal lines. Suppressing the extension of the return current reduces the radiation noise caused by electromagnetic wave.

Since the circuit board of the embodiment has ground lines other than the ground layer, the distances between the signal lines and the grounds are shortened, and the inductance is reduced. Thus, the radiation noise from electromagnetic wave is reduced.

⑥ Generally, an electrostatic test of a printed circuit board on which parts are mounted (e.g., an I/O connector) is made by applying a high-voltage pulse as electrostatic discharge from outside to the circuit board to determine whether the circuit board erroneously operates or not.

Since the circuit board of the embodiment has ground patterns other than the ground layer, the coupling capacitance between the signals and the grounds become large. Accordingly, from the equation $$V=Q/C$$

when the capacitance (C) of the circuit board is large, if the high-voltage pulse (Q) from outside is constant, the induced voltage (V) is small. Thus, the potential difference in the circuit board is lowered and erroneous operation of the circuit board is reduced.

⑦ The circuit board designing method of the embodiment, forming signal pattern without distortion of power line patterns and ground line patterns, can attain a printed circuit board where the distribution of power inductance and the distribution of ground inductance are low and stable, thus reducing costs and time spent for reducing radiation noise and analyzing erroneous operation of the circuit board.

In a case where parts are mounted on a limited space at a high density, there is no space for mounting parts to suppress noise. In portable computers, to reduce the number of circuit boards, spaces for power/ground patterns cannot be ensured. In copying machines, a plurality of circuit boards are connected by cables which may function as antennas. These problems can be solved by the high-density circuit arrangement of the embodiment that reduces radiation noise.

It should be noted that the present embodiment employs the double-sided printed circuit board 11 as a printed circuit board, however, the present invention can be applied to a multi-layer printed circuit board.

As described above, the printed circuit board includes a plurality of conductive layers each having power lines and/or ground lines at a predetermined spacing. The power lines and/or ground lines on each layer have the different directions, and are connected by through holes at overlapping points. This structure equalizes the inductances of the conductive layers where the power line patterns or the ground line patterns are formed and raises the capacitances between the power line patterns and the ground line patterns, thus suppressing the radiation noise from these patterns.

Further, according to the designing method above described, the power line pattern has thick lines each positioned at every several thin lines. The ground lines are arranged in a similar manner to the power lines. This arrangement avoids inconvenience such as shortage of current capacity, and efficiently suppresses the inductance at low frequencies and the inductance at high frequencies, thus obtains a printed circuit board having improved radiation noise characteristics.

Further, the designing method forms signal lines between the power lines or ground lines without distortion of the power line patterns or ground line patterns. This obtains a printed circuit board where the distribution of power inductance and the distribution of ground inductance are low and stable, and greatly reduces costs and time spent for suppressing radiation noise and analyzing erroneous operation of the circuit board.

As many apparently widely different embodiments of the present invention can be made without departing from the spirit and scope thereof, it is to be understood that the invention is not limited to the specific embodiments thereof except as defined in the appended claims.

What is claimed is:

1. A printed circuit board designing method for designing a multi-sided printed circuit board having at least two board surfaces on which a plurality of substantially Parallel power lines and a signal line between two of the power lines are provided, said method comprising the steps of:
   (a) determining a frequency of a signal flowing on the signal line which causes radiation noise; and
   (b) determining a spacing between the power line based on the determined frequency so as to suppress the radiation noise, wherein
      a frequency of a harmonic that is included in a signal that will flow in said circuit board is determined to be the frequency.

2. The printed circuit board designing method according to claim 1, further comprising the step of correcting a value of the predetermined frequency on the basis of a dielectric constant of a material comprising said circuit board, wherein the spacing is determined in accordance with the corrected value of the frequency.

3. The printed circuit board designing method according to claim 1, wherein said circuit board has a plurality of power-supply lines and a plurality of power-return lines as the power lines, and
   wherein the spacing is determined as a spacing between one of the power-supply lines and one of the power-return lines adjacent to each other.

4. The printed circuit board designing method according to claim 1, wherein the plurality of power-supply lines and the plurality of power-return lines are arranged so that one of the power-supply lines and one of the power-return lines alternate with each other.

5. A printed circuit board designing method for designing a multi-sided printed circuit board having at least two board surfaces on which a plurality of substantially parallel power lines and a signal line between two of the power lines are provided, said method comprising the steps of:
   (a) determining a frequency of a signal flowing on the signal line which causes radiation noise; and
   (b) determining a spacing between the power line based on the determined frequency so as to suppress the radiation noise, wherein
      the frequency is determined based on a rising characteristic $t_r$ or a falling characteristic $t_f$ of an output signal of an IC device to be mounted on said circuit board.

6. A printed circuit board designing method for designing a multi-sided printed circuit board having at least two board surfaces on which a plurality of substantially parallel power lines and a signal line between two of the power lines are provided, said method comprising the steps of:
   (a) determining a frequency of a signal flowing on the signal line which causes radiation noise; and
   (b) determining a spacing between the power line based on the determined frequency so as to suppress the radiation noise, wherein
      a length of $\frac{1}{20}$ of a wavelength corresponding to the determined frequency or shorter is determined to be the spacing between the power lines.

7. A printed circuit board designing method for designing a multi-sided printed circuit board having at least two board surfaces on which are provided:
   a first conductive layer where a plurality of first power lines are provided substantially in parallel;
   a second conductive layer, where a plurality of second power lines are provided substantially in parallel and in a direction different from that of the first power lines, separated from the first conductive layer via an insulation layer by a predetermined distance; and
   a plurality of through holes respectively for electrically connecting one of the first power lines on the first conductive layer with one of the second power lines on the second conductive layer at an overlapping point where the first power line and the second power line cross,
   said method comprising the steps of:
      (a) determining a frequency of a signal flowing on a signal line which causes radiation noise; and
      (b) determining, in order to suppress the radiation noise, a spacing between a plurality of through holes for connecting a plurality of power lines which intersect with each other, based on the determined frequency,
         wherein a frequency of a harmonic that is included in a signal that will flow in said circuit board is determined to be the frequency.

8. The printed circuit board designing method according to claim 7, further comprising a step of correcting a value of the determined frequency on the basis of a dielectric constant of a material comprising said circuit board, wherein the spacing is determined in accordance with the corrected value of the frequency.

9. The printed circuit board designing method according to claim 7, wherein the plurality of through holes are adjacent to each other.

10. A printed circuit board designing method for designing a multi-sided printed circuit board having at least two board surfaces on which are provided:
    a first conductive layer where a plurality of first power lines are provided substantially in parallel;
    a second conductive layer, where a plurality of second power lines are provided substantially in parallel and in a direction different from that of the first power lines, separated from the first conductive layer via an insulation layer by a predetermined distance; and
    a plurality of through holes respectively for electrically connecting one of the first power lines on the first conductive layer with one of the second power lines on the second conductive layer at an overlapping point where the first power line and the second power line cross,
    said method comprising the steps of:
       (a) determining a frequency of a signal flowing on a signal line which causes radiation noise; and
       (b) determining, in order to suppress the radiation noise, a spacing between a plurality of through holes for connecting a plurality of power lines which intersect with each other, based on the determined frequency,
          wherein the frequency is determined based on a rising characteristic $t_r$ or a falling characteristic $t_f$ of an output signal of an IC device to be mounted on said circuit board.

11. A printed circuit board designing method for designing a multi-sided printed circuit board having at least two board surfaces on which are provided:

a first conductive layer where a plurality of first power lines are provided substantially in parallel;

a second conductive layer, where a plurality of second power lines are provided substantially in parallel and in a direction different from that of the first power lines, separated from the first conductive layer via an insulation layer by a predetermined distance; and a plurality of through holes respectively for electrically connecting one of the first power lines on the first conductive layer with one of the second power lines on the second conductive layer at an overlapping point where the first power line and the second power line cross, said method comprising the steps of:
(a) determining a frequency of a signal flowing on a signal line which causes radiation noise; and
(b) determining, in order to suppress the radiation noise, a spacing between a plurality of through holes for connecting a plurality of power lines which intersect with each other, based on the determined frequency, wherein a length of 1/20 of a wavelength corresponding to the determined frequency or shorter is determined to be the spacing between the power lines.

12. A printed circuit board designing method for designing a multi-sided printed circuit board having at least two board surfaces on which are provided:

a first conductive layer where a plurality of first power lines are provided substantially in parallel;

a second conductive layer, where a plurality of second power lines are provided substantially in parallel and in a direction different from that of the first power lines, separated from the first conductive layer via an insulation layer by a predetermined distance; and a plurality of through holes respectively for electrically connecting one of the first power lines on the first conductive layer with one of the second power lines on the second conductive layer at an overlapping point where the first power line and the second power line cross, said method comprising the steps of:
(a) determining a frequency of a signal flowing on a signal line which causes radiation noise;
(b) determining, in order to suppress the radiation noise, a spacing between a plurality of through holes for connecting a plurality of power lines which intersect with each other, based on the determined frequency, arbitrarily selecting two of the power lines on the first conductive layer that are separated by a distance corresponding to the determined spacing or shorter; and connecting the selected two power lines on the first conductive layer with one of the power lines on the second conductive layer intersecting the selected two power lines via two through holes.

13. A printed circuit board designing method for designing a multi-sided printed circuit board having at least two board surfaces on which are provided:

a first conductive layer where a plurality of first power lines are provided substantially in parallel;

a second conductive layer, where a plurality of second power lines are provided substantially in parallel and in a direction different from that of the first power lines, separated from the first conductive layer via an insulation layer by a predetermined distance; and a plurality of through holes respectively for electrically connecting one of the first power lines on the first conductive layer with one of the second power lines on the second conductive layer at an overlapping point where the first power line and the second power line cross, said method comprising the steps of:
(a) determining a frequency of a signal flowing on a signal line which causes radiation noise; and
(b) determining, in order to suppress the radiation noise, a spacing between a plurality of through holes for connecting a plurality of power lines which intersect with each other, based on the determined frequency, wherein said circuit board has a plurality of first power-supply lines substantially parallel to each other and a plurality of first power-return lines substantially parallel to each other on the first conductive layer, and a plurality of second power-supply lines substantially parallel to each other and a plurality of second power-return lines substantially parallel to each other on the second conductive layer, and further comprising the step of:
(c) providing the first power-supply lines and the first power-return lines on the first conductive layer so that one of the first power-supply lines and one of the first power-return lines alternate with each other, and providing the second power-supply lines and the second power-return lines on the second conductive layer so that one of the second power-supply lines and one of the second power-return lines alternate with each other.

14. A printed circuit board designing method for designing a multi-sided printed circuit board having at least two board surfaces on which a plurality of parallel power lines and a signal line provided between two of the power lines are provided, comprising the steps of:

(a) determining a frequency of a signal flowing on the signal line which causes radiation noise;
(b) determining a cross-sectional area formed with two of the power lines adjacent to each other, based on the determined frequency; and
(c) determining a spacing between two of the power lines based on the determined cross-sectional area so as to suppress the radiation noise.

15. A multi-sided printed circuit board having at least two board surfaces, comprising:

a plurality of power-supply lines and a plurality of power-return lines disposed on a first layer, wherein
said plurality of power-supply lines and said plurality of power-return lines are provided on said first layer so that one of said power-supply lines and one of said power-return lines alternate in parallel, and
wherein a spacing between one of said power-supply lines and one of said power-return lines adjacent to each other is determined based on a frequency which causes radiation noise on said circuit board,
wherein the frequency is determined based on a rising characteristic tr or a falling characteristic $t_f$ of an output signal of an IC device to be mounted on said circuit board.

16. The printed circuit board according to claim 15, further comprising a plurality of power-supply lines and a plurality of power-return lines, substantially orthogonal to said power-supply lines and said power-return lines on said first layer, on a second layer separated from said first layer by a predetermined distance, wherein said power-supply lines on said first layer and said power-supply lines on said second layer are connected via through holes at overlapping points where said power-return lines on said first layer and said power-return lines on said second layer cross.

17. The printed circuit board according to claim 15, wherein a signal line is provided between one of said power-supply lines and one of said power-return lines on said first layer.

18. A multi-sided printed circuit board having at least two board surfaces, comprising:

a plurality of power-supply lines and a plurality of power-return lines disposed on a first layer, wherein said plurality of power-supply lines and said plurality of power-return lines are provided on said first layer so that one of said power-supply lines and one of said power-return lines alternate in parallel, and wherein a spacing between one of said power-supply lines and one of said power-return lines adjacent to each other is determined based on a frequency which causes radiation noise on said circuit board, wherein said spacing between said power-supply line and said power-return line adjacent to each other is defined by:

$$\alpha \times (\pi \times C \times t)/(3 \times 2 \times 20)$$

where a wave-length reduction rate of said circuit board is $\alpha$, and the speed of light is C.

19. The printed circuit board according to claim 18, wherein when the rising characteristic $t_r$ or the falling characteristic $t_f$ of an output signal of the IC device to be mounted on said circuit board is about 1 ns, the spacing between said power-supply line and said power-return line adjacent to each other is set to 7.5 mm or shorter.

20. A multi-sided printed circuit board having at least two board surfaces comprising:

a plurality of power-supply lines and a plurality of power-return lines on a first layer, wherein said power supply-lines and said power-return lines are provided on said first layer so that one of said power-supply lines and one of said power-return lines alternate with each other substantially in parallel, wherein said power-supply lines form thin lines and thick lines in a pattern where one thick line is provided at every n thin lines, with $n \geq 2$, wherein said power-return lines form thin lines and thick lines in a pattern where one thick line is provided at every m thin lines, with $m \geq 2$, and wherein a spacing between one of said power-supply lines and one of said power-return lines adjacent to each other is determined based on the frequency on said circuit board.

21. The printed circuit board according to claim 20, wherein said thick line has a line width of 1 mm or larger, and said thin lines respectively have a line width shorter than 1 mm.

* * * * *

UNITED STATES PATENT AND TRADEMARK OFFICE
CERTIFICATE OF CORRECTION

PATENT NO. : 5,912,597

DATED : June 15, 1999

INVENTOR(S) : Inagawa et al.

It is certified that error appears in the above-identified patent and that said Letters Patent is hereby corrected as shown below:

COLUMN 13:

Line 11, "Parallel" should read --parallel--.

COLUMN 16:

Line 59, "tr" should read --$t_r$--.

Signed and Sealed this

Eighteenth Day of April, 2000

Attest:

Q. TODD DICKINSON

*Attesting Officer*    *Director of Patents and Trademarks*